(12) United States Patent
Chian et al.

(10) Patent No.: US 8,072,067 B2
(45) Date of Patent: Dec. 6, 2011

(54) SEMICONDUCTOR STRUCTURE

(75) Inventors: Ming-Chung Chian, Changhua County (TW); Tsan-Yao Cheng, Chiayi (TW); Li-Cheng Lin, Taipei County (TW); Hong-Hsiang Tsai, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 167 days.

(21) Appl. No.: 12/436,266

(22) Filed: May 6, 2009

(65) Prior Publication Data

US 2010/0283146 A1      Nov. 11, 2010

(51) Int. Cl.
*H01L 23/48*      (2006.01)

(52) U.S. Cl. ................ 257/737; 257/E23.068

(58) Field of Classification Search ........... 257/E23.068, 257/737, 738, 780, 750–752, 774
See application file for complete search history.

(56) References Cited

U.S. PATENT DOCUMENTS

| | | | |
|---|---|---|---|
| 6,452,270 B1 * | 9/2002 | Huang | 257/738 |
| 6,621,164 B2 * | 9/2003 | Hwang et al. | 257/738 |
| 6,836,023 B2 * | 12/2004 | Joshi et al. | 257/780 |
| 6,897,141 B2 | 5/2005 | Kim | |

* cited by examiner

*Primary Examiner* — Hoa B Trinh
(74) *Attorney, Agent, or Firm* — J.C. Patents

(57) ABSTRACT

A semiconductor structure including a substrate, an insulating layer, a composite pad structure, a passivation layer, and a bump is provided. A circuit structure is disposed on the substrate. The insulating layer covers the substrate and has a first opening exposing the circuit structure. The composite pad structure includes a first conductive layer, a barrier layer, and a second conductive layer which are sequentially disposed. The composite pad structure is disposed on the insulating layer and fills the first opening to electrically connect to the circuit structure. The passivation layer covers the composite pad structure and has a second opening exposing the composite pad structure. The bump fills the second opening and electrically connects to the composite pad structure.

5 Claims, 2 Drawing Sheets

SEMICONDUCTOR STRUCTURE

BACKGROUND OF THE INVENTION

1. Field of the Invention

The present invention relates to a semiconductor structure and a method of fabricating the same, and more particularly to a semiconductor structure including a composite pad structure and a bump and a method of fabricating the same.

2. Description of Related Art

In the flip chip package technology, a plurality of bonding pads is disposed on the active surface of the chip and bumps are formed on the bonding pads respectively. Thus, the chip is electrically connected to the carrier via the bumps on the bonding pads and then to the external electronic devices through the inner circuit of the carrier. Herein, the bonding pads are aluminum bonding pads, and the bumps are gold bumps formed by the wire-bonding process. Generally, in order to form the bumps in a place away form the bonding pads, an insulating layer with an opening exposing the bonding pads can firstly be formed on the chip after the plurality of bonding pads has been formed on the chip, and a conductive layer that is electrically connected to the bonding pads, the passivation layer with an opening exposing the conductive layer, and the bumps filling the opening are formed on the insulating layer sequentially, such that the bumps are electrically connected to the bonding pads via the conductive layer. To give an example, an entire layer of aluminum metal layer is formed between the aluminum bonding pads and the gold bumps, so that the gold bumps are electrically connected to the aluminum bonding pads via the aluminum metal layer.

However, when the gold bumps are electrically connected to the aluminum bonding pads via the aluminum metal layer, the gold of the gold bumps easily diffuses to the aluminum metal layer beneath and reacts therewith under high temperature and high pressure when operating the chip. Therefore, the gold-aluminum intermetallic compound is formed and defects such as a slit and the like are generated at the interface of the gold bumps and the aluminum metal layer. The slit deteriorates the adhesion between the aluminum metal layer and the insulating layer on the chip and the adhesion between the aluminum metal layer and the aluminum bonding pads, thereby influencing the electrical connection between the gold bumps and the aluminum bonding pads. Hence, the lifetime and the reliability of the semiconductor device are affected greatly.

SUMMARY OF THE INVENTION

A semiconductor structure is provided in the present invention, wherein a good electrical connection is established between a composite pad structure and a bump.

A method of fabricating a semiconductor structure is further provided in the present invention to prevent the material of the bump and the material of the composite pad structure from forming an intermetallic compound.

A semiconductor structure including a substrate, an insulating layer, a composite pad structure, a passivation layer, and a bump is provided in the present invention. A circuit structure is disposed on the substrate. The insulating layer covers the substrate and has a first opening exposing the circuit structure. The composite pad structure includes a first conductive layer, a barrier layer, and a second conductive layer that are disposed sequentially. The composite pad structure is disposed on the insulating layer and fills the first opening to electrically connect to the circuit structure. The passivation layer covers the composite pad structure and has a second opening exposing the composite pad structure. The bump fills the second opening and electrically connects to the composite pad structure.

The present invention further provides a method of fabricating a semiconductor structure. Firstly, a substrate having a circuit structure formed thereon is provided. Then, an insulating layer having a first opening that exposes the circuit structure is formed on the substrate. Next, a composite pad structure is formed on the insulating layer. The composite pad structure includes a first conductive layer, a barrier layer, and a second conductive layer disposed sequentially. Moreover, the composite pad structure fills the first opening to electrically connect to the circuit structure. Thereafter, a passivation layer is formed on the composite pad structure. The passivation layer has a second opening exposing the composite pad structure. Afterward, a bump is formed on the passivation layer. The bump fills the second opening and electrically connects to the composite pad structure.

According to an embodiment of the present invention, the materials of the first conductive layer and the second conductive layer are the same.

According to an embodiment of the present invention, the materials of the first conductive layer and the second conductive layer include aluminum-silicon alloy, aluminum-copper alloy, or aluminum-silicon-copper alloy.

According to an embodiment of the present invention, the material of the bump includes gold.

According to an embodiment of the present invention, the material of the barrier layer includes titanium/titanium nitride (Ti/TiN), tungsten nitride (WN), titanium tungsten (TiW) alloy, ruthenium nitride (RuN), iridium nitride (IrN), zirconium nitride (ZrN), Hafnium nitride (HfN), or tantalum nitride (TaN).

In light of the foregoing, the semiconductor structure of the present invention includes the composite pad structure. The composite pad structure has the barrier layer inserted therein, which prevents the material of the bump from diffusing into the composite pad structure. Hence, the formation of the intermetallic compound with the material of the bump and the material of the composite pad structure is prevented, so that a good electrical connection is established between the composite pad structure and the bump, thereby greatly enhancing the reliability of the semiconductor structure.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1D are schematic cross-sectional views illustrating a method of fabricating, a semiconductor structure according to an embodiment of the present invention.

Figure 1A:
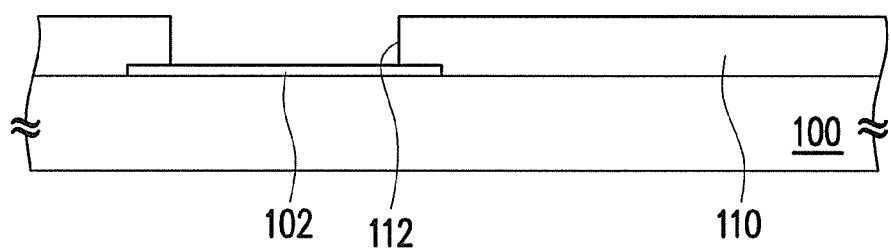
FIGS. 1A to 1D are schematic cross-sectional views illustrating a method of fabricating a semiconductor structure according to an embodiment of the present invention.

First, as shown in FIG. 1A, a substrate 100 having a circuit structure 102 formed thereon is provided. The substrate 100 is a silicon substrate, a glass substrate, or other suitable substrates, for example.

Then, an insulating layer 110 having an opening 112 is formed on the substrate 100, and the opening 112 exposes the circuit structure 102. The material of the insulating layer 110 is silicon oxide, silicon nitride, boron-silicon glass (BSG), phosphorus-silicon glass (PSG), boron-phosphorus-silicon glass (BPSG), a combination thereof, or other suitable insulating materials. The method of forming the insulating layer 110 is the chemical vapor deposition (CVD) process.

Figure 1B:
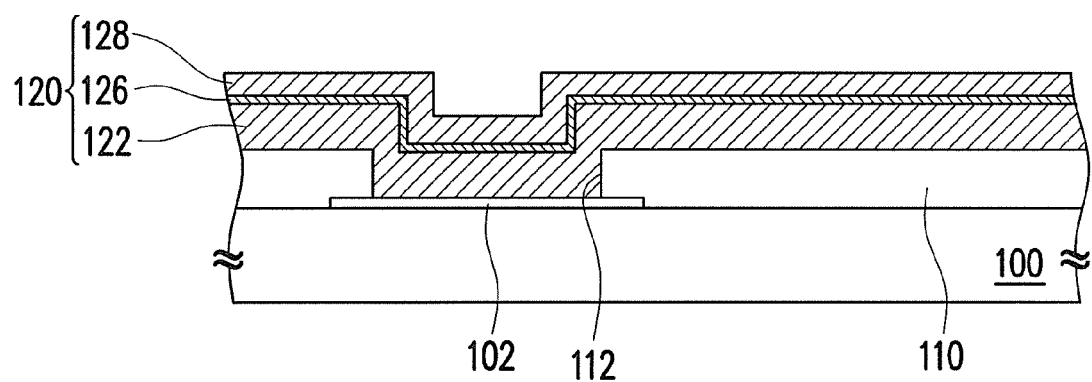

Referring to FIG. 1B, a composite pad structure 120 is formed on the insulating layer 110. The composite pad structure 120 includes a first conductive layer 122, a barrier layer 126, and a second conductive layer 128 that are sequentially disposed. The composite pad structure 120 is disposed on the insulating layer 110 and fills the opening 112 to electrically connect the circuit structure 102. In the present embodiment, the material of the first conductive layer 122 includes aluminum, such as aluminum-silicon alloy, aluminum-copper alloy, or aluminum-silicon-copper alloy. The method of forming thereof is the physical vapor deposition (PVD) process, for example. The material of the barrier layer 126 includes titanium/titanium nitride (Ti/TiN), tungsten nitride (WN), titanium tungsten (TiW) alloy, ruthenium nitride (RuN), iridium nitride (IrN), zirconium nitride (ZrN), Hafnium nitride (HfN), or tantalum nitride (TaN). The method of forming thereof is the PVD process. The material of the second conductive layer 128 includes aluminum, such as aluminum-silicon alloy, aluminum-copper alloy, or aluminum-silicon-copper alloy. The method of forming the second conductive layer 128 is the PVD process, for example. In the present embodiment, the material of the first conductive layer 122 is the same as the material of the second conductive layer 128, for instance. Moreover, in some embodiments, an adhesion layer (not shown) is formed between the circuit structure 102 and the first conductive layer 122. The material thereof can be titanium or other suitable materials.

Figure 1C:
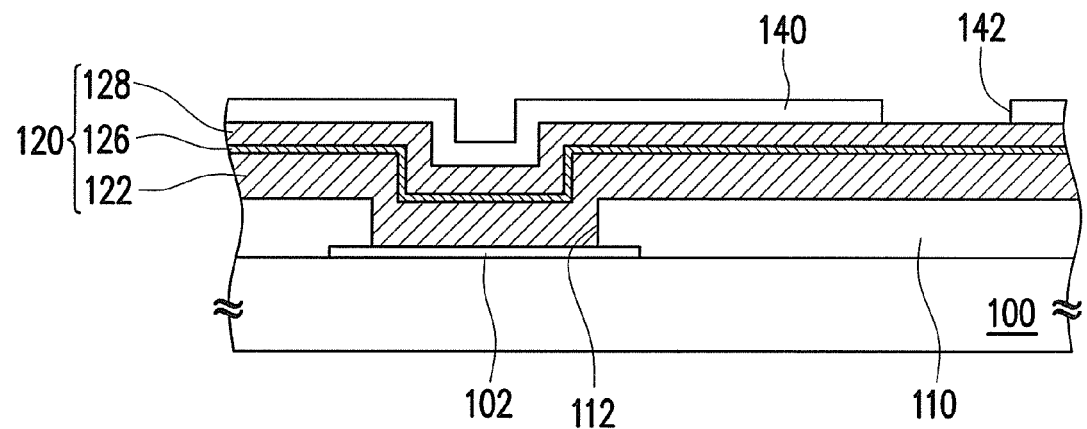

Referring to FIG. 1C, afterward, a passivation layer 140 is formed on the composite pad structure 120. The passivation layer 140 has an opening 142 exposing the composite pad structure 120. The material of the passivation layer 140 is silicon oxide, silicon nitride, BSG, PSG, BPSG, a combination thereof, or other suitable insulating materials. The method of forming thereof is the CVD process.

Figure 1D:
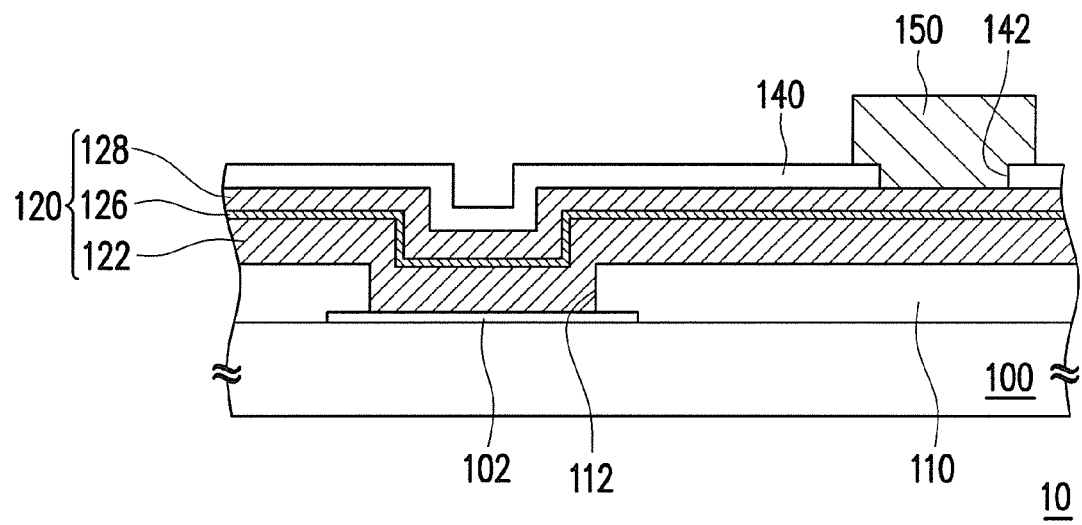

Referring to FIG. 1D, a bump 150 is formed on the passivation layer 140 so as to form a semiconductor structure 10. Herein, the bump 150 fills the opening 142 and electrically connects to the composite pad structure 120. In the present embodiment, the bump 150 is, for instance, a gold bump. The method of forming thereof is electroplating, for example. The bump 150 electrically connects to the composite pad structure 120, and the composite pad structure 120 electrically connects to the circuit structure 102 on the substrate 100. Therefore, the bump 150 electrically connects to the circuit structure 102 via the composite pad structure 120. Hence, the substrate 100 can be electrically connected to a carrier (not shown) via the bump 150 on the composite pad structure 120 and then electrically connected to an external electronic device through an inner circuit within the carrier.

In the present embodiment, the composite pad structure has the barrier layer that is inserted therein. The barrier layer prevents the material of the bump from diffusing into the composite pad structure. To give an example, when the material of the conductive layer of the composite pad structure is aluminum-copper alloy and the bump is gold bump, the barrier layer of the composite pad structure prevents the gold in the bump from diffusing into the composite pad structure under high temperature and high pressure. Therefore, the reaction of gold and aluminum-copper alloy and the resulting formation of the intermetallic compound are prevented. In addition, the weak adhesion and the even the peeling between the composite pad structure and the insulating layer or between the composite pad structure and the bump due to the slit generated at the interface of the bump and the composite pad structure are also prevented. Therefore, the composite pad structure and the bump of the present embodiment have a strong adhesion and electrical connection between each other, thereby greatly enhancing the lifetime and the reliability of the semiconductor structure.

In summary, the composite pad structure has the barrier layer that is inserted therein. The barrier layer prevents the material of the bump from diffusing into the composite pad structure. In other words, the barrier layer of the composite pad structure prevents the material of the bump from diffusing into the composite pad structure and reacting therewith under high temperature and high pressure. As a result, the formation of the intermetallic compound is prevented, and the weak adhesion and even the peeling between the composite pad structure and the insulating layer or between the composite pad structure and the bump due to the slit generated at the interface of the bump and the composite pad structure are also prevented. Hence, strong adhesion and good electrical connection are present between the composite pad structure and the bump, thereby greatly enhancing the lifetime and the reliability of the semiconductor structure. In addition, the method of fabricating the semiconductor structure can be combined with the current fabricating steps, so that the fabricating steps are not modified greatly and the cost of the subsequent fabricating is reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor structure, comprising:
a substrate, having a circuit structure disposed thereon;
an insulating layer, disposed on the substrate and having a first opening exposing the circuit structure;
a composite pad structure, comprising a first conductive layer, a barrier layer, and a second conductive layer disposed sequentially, disposed on the insulating layer, and filling the first opening to electrically connect to the circuit structure;
a passivation layer, covering the composite pad structure and having a second opening exposing the composite pad structure; and
a bump, filling the second opening and electrically connecting to the composite pad structure, wherein the conductive layer, the barrier layer, and the second conductive layer form a sandwich layer conforming to a structure of the first opening and the insulating layer, and the sandwich layer extends continuously below the second opening.

2. The semiconductor structure as claimed in claim 1, wherein materials of the first conductive layer and the second conductive layer are the same.

3. The semiconductor structure as claimed in claim 1, wherein materials of the first conductive layer and the second conductive layer comprise aluminum-silicon alloy, aluminum-copper alloy, or aluminum-silicon-copper alloy.

4. The semiconductor structure as claimed in claim 1, wherein a material of the bump comprises gold.

5. The semiconductor structure as claimed in claim 1, wherein a material of the barrier layer comprises titanium/titanium nitride (Ti/TiN), tungsten nitride (WN), titanium tungsten (TiW) alloy, ruthenium nitride (RuN), iridium nitride (IrN), zirconium nitride (ZrN), Hafnium nitride (HfN), or tantalum nitride (TaN).

* * * * *